United States Patent
He

(10) Patent No.: US 9,018,712 B2
(45) Date of Patent: Apr. 28, 2015

(54) TRANSISTORS AND FABRICATION METHODS THEREOF USING A STACKED PROTECTION LAYER

(71) Applicants: Semiconductor Manufacturing International (Beijing) Corporation, Beijing (CN); Semiconductor Manufacturing International (Shanghai) Corporation, Shanghai (CN)

(72) Inventor: Yonggen He, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/144,696

(22) Filed: Dec. 31, 2013

(65) Prior Publication Data
US 2015/0061028 A1    Mar. 5, 2015

(30) Foreign Application Priority Data
Aug. 27, 2013   (CN) .......................... 2013 1 0378974

(51) Int. Cl.
*H01L 21/8238*    (2006.01)
*H01L 27/092*    (2006.01)

(52) U.S. Cl.
CPC ...... *H01L 21/823814* (2013.01); *H01L 27/092* (2013.01)

(58) Field of Classification Search
CPC ..................... H01L 21/823814; H01L 27/092
USPC .................................................. 438/300, 305
See application file for complete search history.

(56) References Cited

U.S. PATENT DOCUMENTS 8,358,012 B2 *    1/2013   Haran et al. .................. 257/774

* cited by examiner

*Primary Examiner* — William Coleman
(74) *Attorney, Agent, or Firm* — Anova Law Group, PLLC

(57) ABSTRACT

A method is provided for fabricating a transistor. The method includes providing a semiconductor substrate having a first region; and forming a first gate structure on a surface of the semiconductor substrate in the first region. The method also includes forming trenches in the semiconductor substrate at both sides of the first gate structure; and forming a first stress layer with one surface lower than the surface of the semiconductor substrate in the trenches. Further, the method includes forming a second stress layer containing carbon atoms with a surface leveling with or higher than the surface of the semiconductor substrate on the first stress layer; and forming a source region and a drain region in the semiconductor substrate at both sides of the first gate structure.

16 Claims, 5 Drawing Sheets

US 9,018,712 B2

TRANSISTORS AND FABRICATION METHODS THEREOF USING A STACKED PROTECTION LAYER

CROSS-REFERENCES TO RELATED APPLICATIONS

This application claims the priority of Chinese patent application No. 201310378974.9, filed on Aug. 27, 2013, the entirety of which is incorporated herein by reference.

FIELD OF THE INVENTION

The present invention generally relates to the field of semiconductor manufacturing technology and, more particularly, relates to transistors and fabrication techniques.

BACKGROUND

With the rapid development on semiconductor technology, a carrier mobility enhanced technology has attracted extensive research and applications. The drive current of a MOS device may be increased by increasing the carrier mobility of its channel region, thus the performance of the CMOS device may be improved.

Because the band gap and carrier mobility of silicon material may be changed by a stress, improving the performance of CMOS devices by the stress has become a more and more common method. Specifically, by properly controlling the stress, the carrier mobility of the MOS devices may be increased, and the drive current may be increased, where the carriers of an NMOS transistor are electrons; and the carriers of a PMOS transistor are holes. Thus, the performance of MOS transistor may be significantly enhanced by increasing the carrier mobility.

The embedded SiGe technology is a common method to generate stress in the CMOS devices. The embedded SiGe technology may include forming a SiGe layer before forming a source region and a drain region; followed by doping the SiGe layer to form the source region and the drain region. A compressive stress may be generated because of the lattice mismatch between the silicon substrate and the embedded SiGe, thus the performance of the PMOS transistor may be improved.

Theoretically the embedded SiGe technology may increase the carrier mobility of transistors to a certain extent. However, in practical fabrication processes of the transistors, the quality of the embedded SiGe may need further improvements. The disclosed methods and devices are directed to solve one or more problems set forth above and other problems.

BRIEF SUMMARY OF THE DISCLOSURE

One aspect of the present disclosure includes a method for fabricating a transistor. The method includes providing a semiconductor substrate having a first region; and forming a first gate structure on one surface of the semiconductor substrate in the first region. The method also includes forming trenches in the semiconductor substrate at both sides of the first gate structure; and forming a first stress layer with one surface lower than the surface of the semiconductor substrate in the trenches. Further, the method includes forming a second stress layer containing carbon atoms with a surface leveling with or higher than the surface of the semiconductor substrate on the first stress layer; and forming a source region and a drain region in the semiconductor substrate at both sides of the first gate structure.

Another aspect of the present disclosure includes a transistor. The transistor includes a semiconductor substrate having a first region; and a first gate structure formed on one surface of the semiconductor substrate in the first region. The transistor also includes a first stress layer with a top surface lower than the surface of the semiconductor substrate formed in the semiconductor substrate at both sides of the first gate structure; and a second stress layer containing carbon atoms formed on the first stress layer. Further, the transistor includes a source region and a drain region formed in the semiconductor substrate at both sides of the first gate structure.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
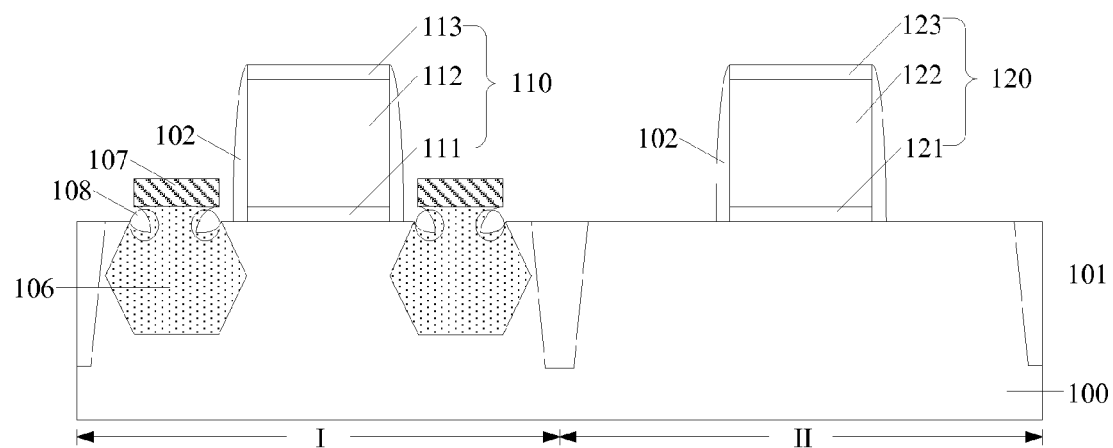
FIG. 1 illustrates an exemplary transistor consistent with the disclosed embodiments.

FIG. 1 illustrates an exemplary fabrication process and a corresponding structure of a transistor.

As shown in FIG. 1, the fabrication process of a transistor may include providing a semiconductor substrate 100; and forming isolation structures 101 in the semiconductor substrate 100. The semiconductor substrate 100 may include a first region and a second region. In one embodiment, the first region may be a PMOS region; and the second region may be a NMOS region.

A first gate structure 110 may be formed on one surface of the semiconductor substrate 100 in the PMOS region; and a second gate structure 120 may be formed on the surface of the semiconductor substrate 100 in the NMOS region. The first gate structure 110 may include a first gate oxide layer 111 formed on the surface of the semiconductor substrate 100, a first gate electrode layer 112 formed on the first oxide layer 111 and a cap layer 113 formed on the first gate layer 112.

The second electrode structure 120 may include a second gate oxide layer 121 formed on the surface of the substrate 100, a second gate electrode layer 122 formed on the second gate oxide layer 121 and a second cap layer 123 formed on the second gate electrode layer 122.

Further, as shown in FIG. 1, first trenches (not labeled) may be formed in the semiconductor at both sides of the first gate structure 100; and a first stress layer 106 may be formed in each of the first trenches.

Further, a first photoresist layer (not shown) may be formed on surfaces of the first gate structure 110, the second gate structure 120, the first stress layers 106 and the semiconductor substrate 100. The first photoresist layer may have openings corresponding to positions of the first stress layer 106.

Then, a source/drain ion implantation process may be performed on to the semiconductor substrate 100 at both sides of the first gate structure 110 using the first photoresist layer as an etching mask. After forming a source region (not labeled) and a drain region (not labeled) at both sides of the first gate structure 110, the first photoresist layer may be removed.

Further, after removing the first photoresist layer, a second photoresist layer (not shown) may be formed on surfaces of the first gate structure 110, the second gate structure 120, the first stress layers 106 and the semiconductor substrate 100. The second photoresist layer may have openings corresponding to a subsequently formed source region and a drain region at both sides of the second gate structure 120.

Then, a source/drain ion implantation process may be performed onto the surface of the semiconductor substrate 100 at both sides of the second gate structure 120; and a source region (not shown) and a drain region (not shown) may be formed in the semiconductor substrate 100 at both sides of the second gate structure 120. After forming the source region and the drain region in the semiconductor substrate 100 at both sides of the second gate structure 120, the second photoresist layer may be removed.

In order to increase the stress in the channel region of a transistor and increase the carrier mobility of the channel region, so as to increase a drive current of the transistor and significantly increase electric properties of the transistor, the first stress layer 106 may be made of SiGe. Because the crystal lattice of SiGe may be different from the crystal lattice of Si in the semiconductor substrate 100, the stress in the channel region may be increased; and the drive current of the transistor may be increased. Further, comparing to Si, Ge may have a higher carrier mobility, thus the higher a percentile of Ge in SiGe, the higher a lattice mismatch of the first stress layer 106. Therefore, the stress generated in the channel region may be greater; the enhancement of the carrier mobility may be greater; and the performance of the transistor may be significantly enhanced.

After removing the first photoresist layer and the second photoresist layer, morphology of the first stress layer 106 may be changed. For example, as shown in FIG. 1, damages 108 may be generated at interfaces of the first stress layer 106 and the surface of the semiconductor substrate 100; and a portion of the first stress layer 106 at the interfaces of the first stress layer 106 and the surface of the semiconductor substrate 100 may be eroded.

One possible reason causing the portion of stress layer 106 at the interfaces of the stress layer 106 and the surface of the semiconductor substrate 100 to be eroded may be the processes for removing the first photoresist layer and the second photoresist layer. A process for removing the first photoresist layer and/or the second photoresist layer may be a wet cleaning process, or a plasma ashing process.

When a wet cleaning process is used to remove the first photoresist layer and the second photoresist layer, a substrate having the first photoresist layer or the second photoresist layer may be put into a container having wet chemicals; and the wet chemicals may be sprayed on the first photoresist layer or the second photoresist layer to remove the first photoresist layer or the second photoresist layer.

When a plasma ashing process is used to remove the first photoresist layer or the second photoresist layer, the plasma ashing process may be equivalent to a plasma etching process. By using a microwave plasma or a radio frequency plasma, oxygen, hydrogen or fluoride-contained gases may be converted to plasma. When the first photoresist layer or the second photoresist layer is exposed to the plasma, such as an oxygen plasma, active ions of the plasma may react with the first photoresist layer or the second photoresist layer, thus the first photoresist layer or the second photoresist layer may be removed.

After the source/drain ion implantation process, a hard layer may be formed on the first photoresist layer and the second photoresist layer, it may be easy for the plasma ashing process to remove the hard layer. However, the plasma ashing process may be unable to completely remove the first photoresist layer or the second photoresist layer, by-products may be formed on the surface of the semiconductor substrate 100, such as $Si-C_{12}-O$, or $Si-Br_2-O$, etc. Therefore, after the plasma ashing process, it may still need a wet cleaning process to clean the residue photoresist layer and the by-products of the plasma ashing process.

Therefore, all of the processes for removing the first photoresist layer or the second photoresist layer may include a wet cleaning process.

Dislocation defects may be formed in the first stress layers 106 because of the lattice mismatch between SiGe and Si, the higher the percentile of Ge in the SiGe, the more the dislocation defects. In a process for forming a transistor, in order to increase the stress generated by the first stress layer 106 in the channel region, the atomic percentile of Ge in the first stress layer 106 may often be relatively large, for example, the atomic percentile of Ge in the first stress layer 106 may be in a range up to approximately 20%~50%. Thus, such a high percentile of Ge in the first stress layer 106 may cause the first stress layer 106 to have more dislocation defects, and a density of the first stress layers 106 may be reduced. The reduced density may cause the first stress layers 106 to be easily damaged by wet chemicals. Further, Ge may have a relatively low stability, and may easily be eroded by wet chemicals. If the first stress layer 106 has a higher percentile of Ge, the stability may be lower, and the first stress layers 106 may easily be etched.

All of the processes for removing the first photoresist layer or the second photoresist layer may include a wet cleaning process, and the wet cleaning process may have wet chemicals, such as $NH_4OH$ and $H_2O_2$, etc. Thus, when SiGe in the first stress layer 106 contacts with the wet chemicals during the process for removing the first photoresist layer and the second photoresist layer, the wet chemicals may diffuse into the first stress layers 106 with a lower density and a worse stability, and a portion of SiGe in the first stress layer 106 may be eroded by the wet chemicals. The first stress layers 106 in the proximity region of the surface of the semiconductor substrate 100 may have more severe erosion; and the damages 108 illustrated in the FIG. 1 may be formed.

Figure 2:
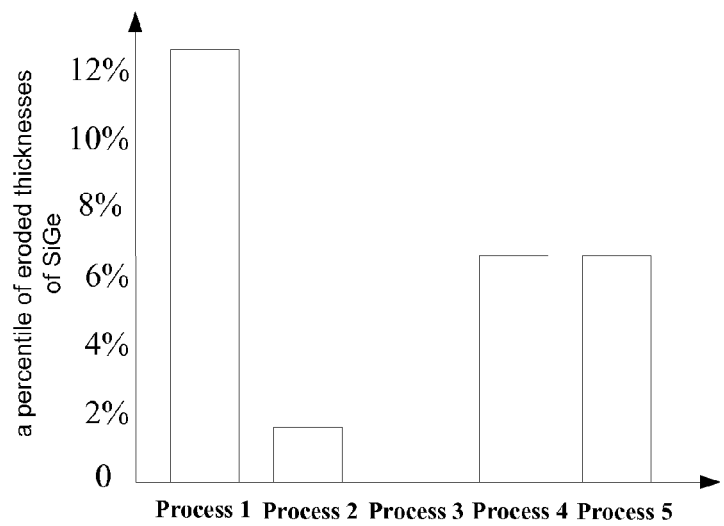
FIG. 2 illustrates a percentile of eroded thicknesses of SiGe to a thickness of a SiGe stress layer corresponding to different methods consistent with disclosed embodiments.

FIG. 2 illustrates a percentile of eroded thicknesses of SiGe to a thickness of a SiGe stress layer corresponding to different methods consistent with disclosed embodiments.

As shown in FIG. 2, the process 1 may be a NVDH10ARCA process. Chemicals of theNVDH10ARCA process may include diluted HF, SC1 and SC2. Wherein the SC1 may include $NH_4OH$, $H_2O_2$ and $H_2O$; and the SC2 may include HCl, $H_2O_2$ and $H_2O$. When theNVDH10ARCA process is used, the percentile of the eroded thickness of SiGe to the thickness of the SiGe stress layer may be in a range of approximately 12%~13%

The process 2 may be an SPM process. Chemicals of the SPM process may include HCl, $H_2O_2$ and $H_2O$. When the SPM process is used, the percentile of the eroded thicknesses of SiGe to the thickness of the SiGe stress layer may be in a range of approximately 1%~2%.

The process 3 is an SC2 process. Chemicals of the SC2 process may include HCl, $H_2O_2$ and $H_2O$. The SC2 process may often be used to clean metal ions, and may not be used to clean photoresist layer.

The process 4 may be an NPRRMSC1 process. Chemicals of the NPRRMSC1 process may include SPM and SC1. Wherein the SPM may include $H_2SO_4$ and $H_2O_2$; and the SC1 may include $NH_4OH$, $H_2O_2$ and $H_2O$. When NPRRMSC1 process is used, the percentile of the eroded thickness of SiGe to the thickness of the SiGe stress layer may be in a range of approximately 6%~7%.

The process 5 may be an Ash+NPRRMSC1 process. The Ash+NPRRMSC1 process may include an ashing process and the NPRRMSC1 process. Chemicals of the NPRRMSC1 process may include SPM and SC1. Wherein the SPM may include $H_2SO_4$ and $H_2O_2$; and the SC1 may include $NH_4OH$, $H_2O_2$ and $H_2O$. When the Ash+NPRRMSC1 process is used, the percentile of the eroded thickness of SiGe to the thickness of the SiGe stress layer may be in a range of approximately 6%~7%.

Thus, as shown FIG. 2, using any one of the NVDH10ARCA process, the SPM process, the NPRRMSC1 process and the Ash+NPRRMSC1 process, may all generate a certain degree of damages to SiGe of the first stress layer 106; and the damages may locate at regions of interfaces between the first stress layers 106 and the semiconductor substrate 100. Therefore, a stress in the channel region of a transistor caused by the first stress layers 106 may be affected; and electric properties of the transistor may be deteriorated. A stress layer having a first stress layer and a second stress layer containing carbon is disclosed to overcome these issues.

Figure 10:
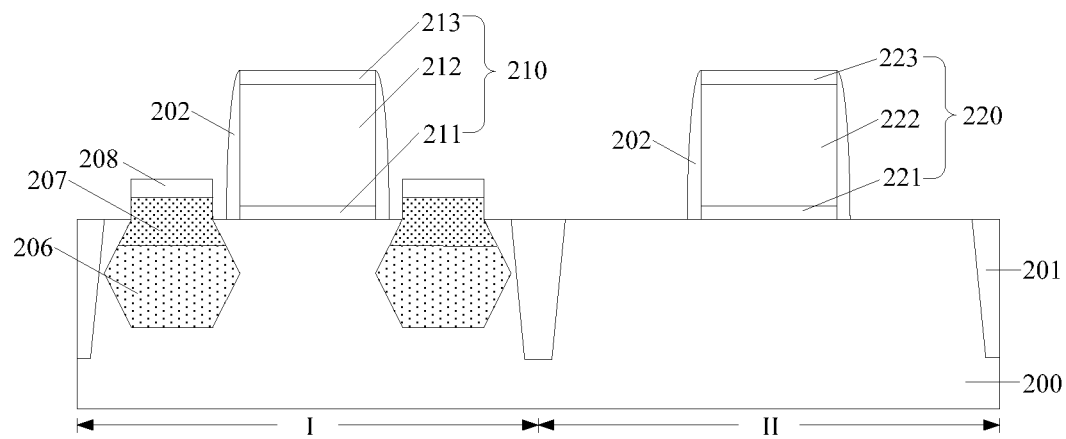
Figure 11:
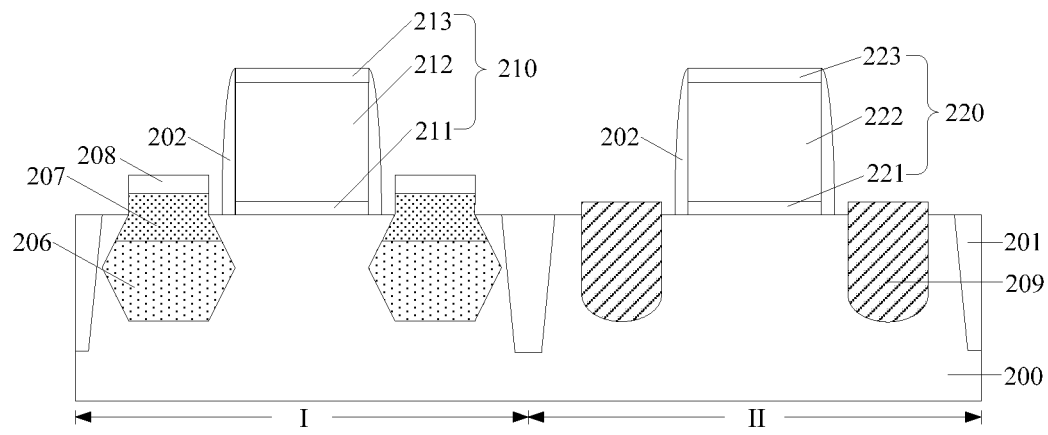
Figure 12:
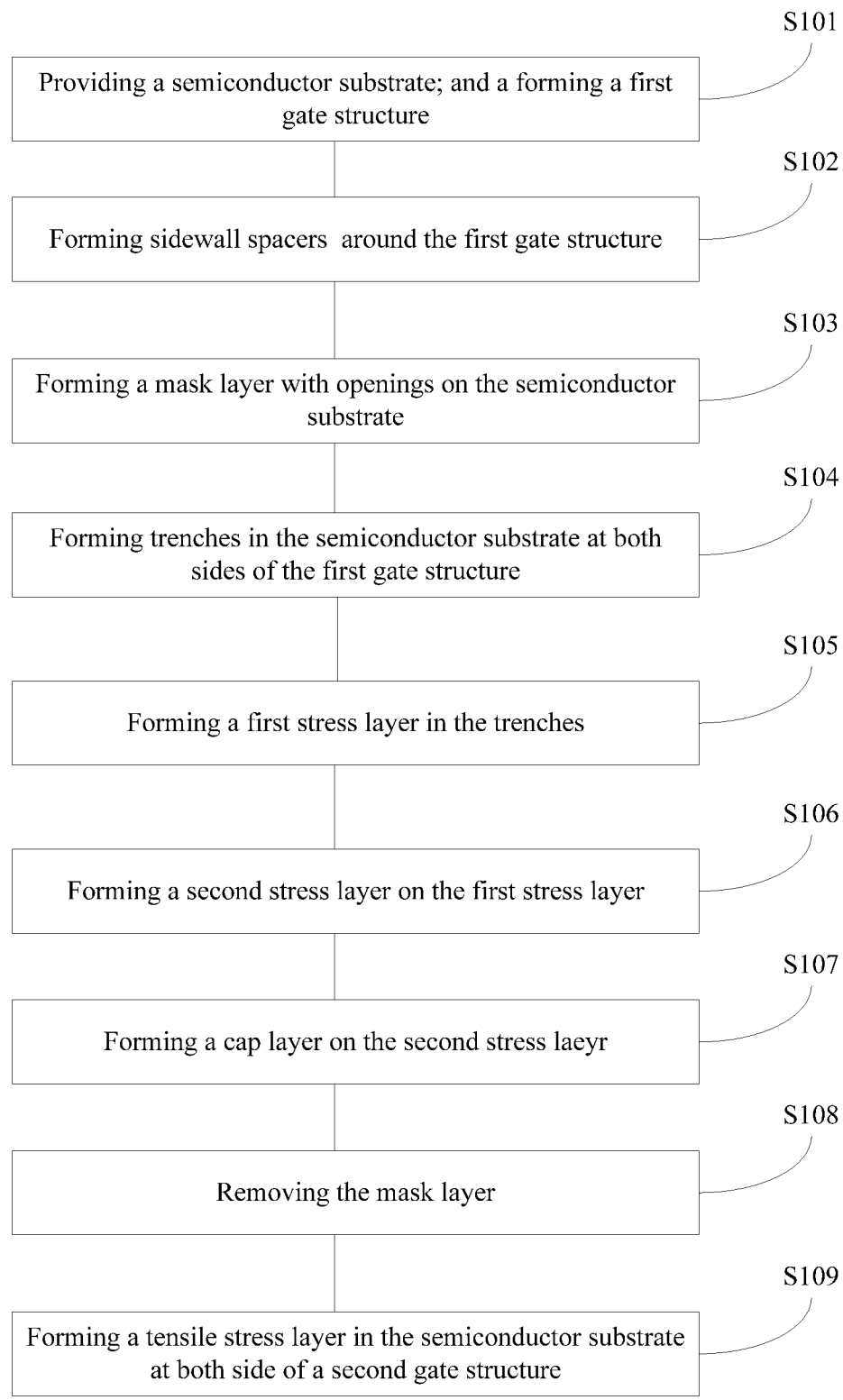
FIG. 12 illustrates an exemplary fabrication process of a transistor consistent with the disclosed embodiments.

FIGS. 3~11 illustrate semiconductor structures corresponding to certain stages of an exemplary fabrication process of another transistor consistent with disclosed embodiments; and FIG. 12 illustrates an exemplary fabrication process of the transistor consistent with the disclosed embodiments.

Figure 3:
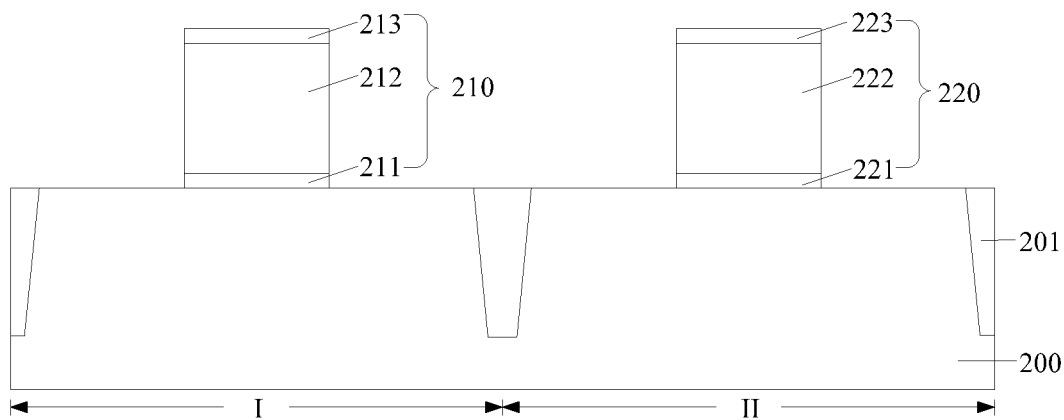
FIGS. 3~11 illustrate semiconductor structures corresponding to certain stages of an exemplary fabrication process of a transistor consistent with disclosed embodiments.

As shown in FIG. 12, at the beginning of the fabrication process, a substrate with certain structures is provided (S101). FIG. 3 illustrates a corresponding semiconductor structure.

As shown in FIG. 3, a semiconductor substrate 200 is provided. The semiconductor substrate 200 may have a first region I. A first gate structure 210 may be formed on a surface of the semiconductor substrate 200 in the first region I. In one embodiment, the first region I may be a PMOS region. For illustrative purposes, a PMOS region I may be used to refer to the first region I. Correspondingly, a PMOS gate structure may be used to refer to the first gate structure 210.

Optionally and additionally, the semiconductor substrate 200 may have a second region II; and a second gate structure 220 may be formed on one surface of the semiconductor substrate 200 in the second region II. For illustrative purposes, an NMOS region II may be used to refer to the second region II. Correspondingly, an NMOS gate structure may be used to refer to the second gate structure 220.

As shown in FIG. 3, for illustrative purposes, the PMOS region I is on the left side; and the NMOS region II is on the right side. In certain other embodiments, the PMOS region I may be on the right side; and the NMOS region II is on the left side.

The semiconductor substrate 200 may include any appropriate type of semiconductor material, such as single crystal silicon, poly silicon, amorphous silicon, silicon germanium, carborundum, indium antimonide, lead telluride, indium arsenide, indium phosphide, gallium arsenide, gallium antimonide, alloy semiconductor, epitaxially grown materials and/or silicon on insulator (SOI). The semiconductor substrate 100 may also provide a base for subsequent processes and structures.

Optionally and additionally, after providing the semiconductor substrate 200, isolating structures 201 may be formed in the semiconductor substrate 200. The isolation structures 201 may be used to prevent adjacent transistors from forming electrical connections. The isolation structures 201 may be made of any appropriate material, such as one or more of silicon oxide, silicon nitride, or silicon oxynitride, etc.

In one embodiment, the semiconductor substrate 200 is single crystal silicon. The isolation structures 201 are shallow trenches isolation (STI) structures formed by any appropriate process. The STI structures 201 are made of silicon oxide.

Further, in certain other embodiments, after providing the semiconductor substrate 200, an n-well may be formed in the PMOS region I; and a low dose p-type ion implantation process may be performed onto the n-well. The p-type ions of the low-dose p-type ion plantation process may include one or more of B ions, Ga ions and In ions, etc. A p-well may also be formed in the NMOS region 2; and a low dose n-type ion implantation process may also be performed onto the n-well. The ions of the low dose n-type ion implantation process may include one or more of As ions, P ions and Sb ions, etc. The low-dose ion implantation process may be used to improve threshold voltages of the PMOS region I and/or the NMOS region II; and optimize the electrical properties of the transistor.

Further, as shown in FIG. 3, in one embodiment, the PMOS gate structure 210 may include a first gate dielectric layer 211 formed on the surface of semiconductor substrate 200 in the PMOS region I; a first gate electrode layer 212 formed on the first gate dielectric layer 211 and a first cap layer 213 formed on the first gate electrode layer 212. The NMOS gate structure 220 may include a second gate dielectric layer 221 formed on the surface of the semiconductor substrate 200 in the NMOS region II, a second gate electrode layer 222 formed on the second gate dielectric layer 221 and a second cap layer 223 formed on the second electrode layer 222.

The first dielectric layer 211 may be made of any appropriate material, such as $SiO_2$, or high dielectric constant material including one or more of $HfO_2$, HfSiO, HfSiON, HfTaO, HfTiO, HfZrO, $ZrO_2$, or $Al_2O_3$, etc. Various processes may be used to form the first dielectric layer 211, such as a chemical vapor deposition (CVD) process, a physical vapor deposition (PVD) process, an atomic layer deposition (ALD) process, or a flowable CVD (FCVD) process, etc.

The second dielectric layer 221 may be made of any appropriate material, such as $SiO_2$, or high dielectric constant material including one or more of $HfO_2$, HfSiO, HfSiON, HfTaO, HfTiO, HfZrO, $ZrO_2$, or $Al_2O_3$, etc. Various processes may be used to form the first dielectric layer 221, such as a CVD process, a PVD process, an ALD process, or an FCVD process, etc.

The first gate electrode layer 212 may be a single layer, or a multiple-stacked layer structure. The first gate electrode layer 212 may be made of any appropriate material, such as one or more of poly silicon, TiN, TaN, WAl, W, Al, Cu, etc. Various processes may be used to form the first gate electrode layer 212, such as a CVD process, a PVD process, a sputtering process or an electroplating process, etc.

The second gate electrode layer 222 may be a single layer, or a multiple-stacked layer structure. The second gate electrode layer 222 may be made of any appropriate material, such as one or more of poly silicon, TiN, TaN, WAl, W, Al, Cu, etc. Various processes may be used to form the second gate electrode layer 222, such as a CVD process, a PVD process, a sputtering process or an electroplating process, etc.

The first cap layer 213 and the second cap layer 223 may be made of any appropriate material, such as $SiO_2$, SiN, or SiON, etc. Various processes may be used to form the first cap layer 213 and the second cap layer 223, such as a CVD process, a PVD process, an ALD process, or an FCVD process, etc.

In one embodiment, the first cap layer 213 and the second cap layer 223 are made of SiN. The first cap layer 213 and the second capping layer 223 may be used to protect the first gate electrode layer 221 and the second gate electrode layer 222. SiN may be unable to react with any inorganic acid but HF; and may have a significantly strong anti-corrosion ability. Further, SiN may not be infiltrated or corroded by Al, Cu, or Ni, etc. Therefore, the first cap layer 213 and the second cap layer 223 may prevent the first electrode layer 221 and the second electrode layer 222 from being damaged by subsequent processes.

In certain other embodiments, the first cap layer 213 and the second cap layer 223 may be omitted.

Figure 4:
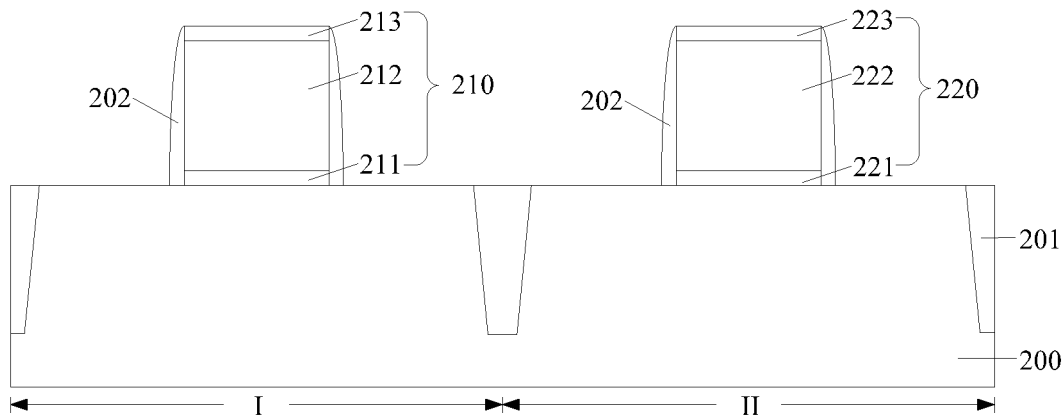

Returning to FIG. 12, after providing the semiconductor substrate 200 with the PMOS gate structure 210 and the NMOS gate structure 220, sidewall spacers may be formed on the PMOS gate structure 210 and the NMOS gate structure 220 (S102). FIG. 4 illustrates a corresponding semiconductor structure.

As shown in FIG. 4, sidewall spacers 202 are formed on the surface of the semiconductor substrate 200 near to the PMOS gate structure 210 and the NMOS gate structure 220, and side surfaces of the PMOS gate structure 210 and the NMOS gate structure 220. The sidewall spacers 202 may be used to protect the side surfaces of the PMOS gate structure 210 and the NMOS gate structure 220; and prevent the PMOS gate structure 210 and the NMOS gate structure 220 from being damaged by subsequent processes.

The sidewall spacers 202 may be made of any appropriate material, such as one or more of silicon oxide, silicon nitride, or silicon oxynitride, etc. The sidewall spacers 202 may be formed by depositing a sidewall spacer material layer on the surface of the semiconductor substrate 200, and side surfaces and top surfaces of the PMOS gate structure 210 and the NMOS gate structure 220, followed by an etch back process. After the etch back process, a portion of the sidewall spacer material layer on the surface of the semiconductor substrate 200 and the top surfaces of the PMOS gate structure 210 and the NMOS gate structure 220 may be removed. Thus, the sidewall spacers 202 on the side surfaces of the PMOS gate structure 210 and the NMOS gate structure 220 may be formed.

In certain other embodiments, the sidewall spacers 202 may be omitted. The sidewall spacers 202 may also be dummy gate sidewall spacers, after subsequently forming a cap layer, the sidewall spacer 202 may be removed.

In certain other embodiments, lightly doped drain (LDD) regions may be formed in the semiconductor substrate 200 at both sides of the PMOS gate structure 210 and the NMOS gate structure 220 before forming the sidewall spacers 202. The LDD regions may be used to prevent a hot electron degradation effect.

Figure 5:
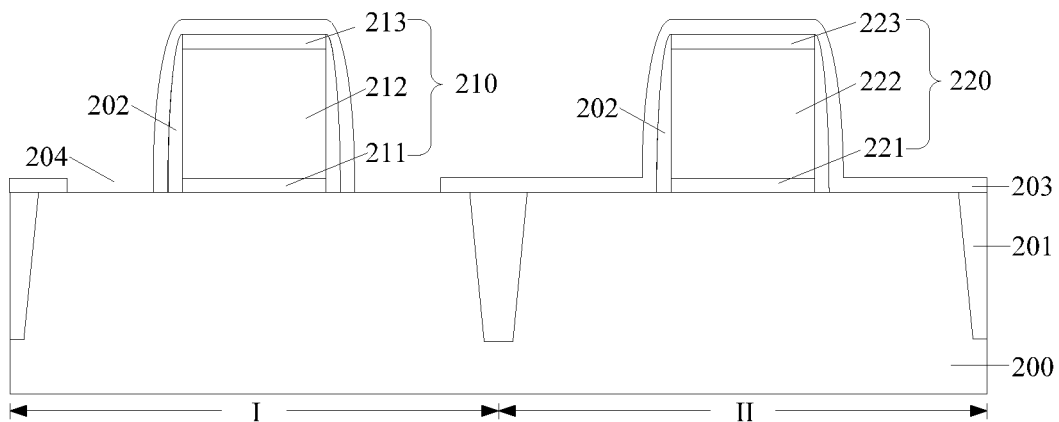

Returning to FIG. 12, after forming the sidewall spacers 202, a mask layer covering the PMOS gate structure 210 and the NMOS gate structure 220 may be formed on the semiconductor substrate 200 (S103). FIG. 5 illustrates a corresponding semiconductor structure.

As shown in FIG. 5, a mask layer 203 is formed on the surface of the semiconductor substrate 200. The mask layer 203 may also cover the surface of the sidewalls 202 and the top surfaces of the PMOS gate structure 210 and the NMOS gate structure 220. The mask layer 203 may have openings 204 on the surface of the semiconductor substrate 200 at both sides of the PMOS gate structure 210. The openings 204 may be used to subsequently form trenches.

The mask layer 203 may be made of any appropriate material, such as silicon oxide, silicon nitride, or silicon oxynitride, etc. The mask layer 203 may also be a stacked layer made of different materials. The stacked layer may increase a selective etching ratio of the mask layer 203.

Various processes may be used to form the mask layer 203, such as a PVD process, a CVD process, an FCVD process, an ALD process, or an epitaxial growth process, etc. In one embodiment, the mask layer 203 is formed by a low-pressure ALD process.

In one embodiment, the mask layer 203 is made of silicon oxide. A thickness of the mask layer 203 may be in a range of approximately 50 Å~800 Å. If the thickness of the mask layer 203 is substantially small, the semiconductor substrate 200 may be overly etched by subsequent etching processes. If the thickness of the mask layer 203 is significantly large, it may take more time to etch the mask layer 203 to form the openings 204; and it may reduce the efficiency for forming transistors.

The openings 204 may be formed by any appropriate process. In one embodiment, the openings 204 may be formed by etching the mask layer 203 using a patterned photoresist layer as an etching mask.

Various processes may be used to etch the mask layer 203, such as a dry etching process, or a wet etching process, etc. In one embodiment, a dry etching process is used to etch the mask layer 203 to form the openings 204.

Figure 6:
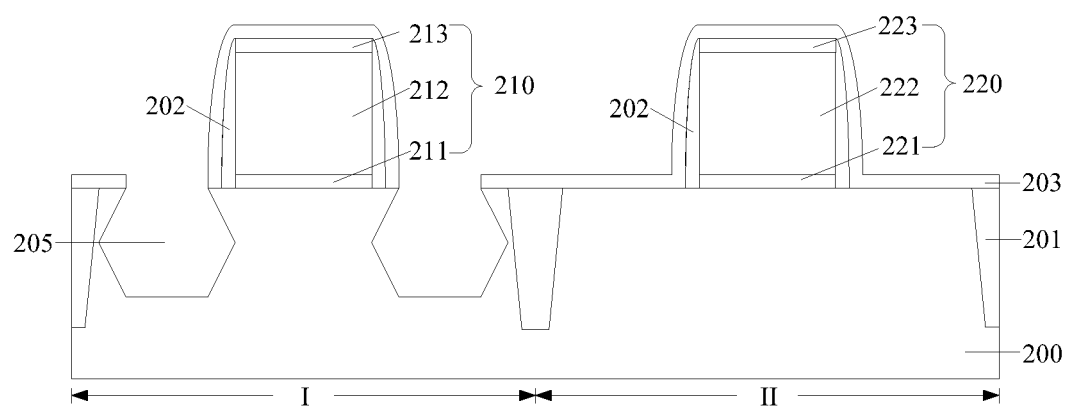

Returning to FIG. 12, after forming the mask layer 203 with the openings 204, trenches may be formed in the semiconductor substrate 200 at both sides of the PMOS gate structure 210 (S104). FIG. 6 illustrates a corresponding semiconductor structure.

As shown in FIG. 5, trenches 205 are formed in the semiconductor substrate 200 at both sides of the PMOS gate structure 210. The trenches 205 may have a "Σ" shape. The trenches 205 may also have other appropriate shape, such as a rectangular shape, or an "U" shape, etc.

The "Σ" shape sidewalls of the trenches 205 may concave toward a channel region of the PMOS device; such a shape may effectively shorten a channel length of the PMOS device, and match a requirement of the device miniaturization. Further, the "Σ" shape may have a relatively large shear force under a gate grid gap, thus a material formed in the "Σ" shape trenches 205 may generate a significantly large stress in the channel region of the PMOS device.

Various processes may be used to form the trenches 205, such as a dry etching process, a wet etching process, or a combination of a dry etching process and a wet etching process, etc. In one embodiment, the trenches 205 are formed by a combination of a dry etching process and a wet etching process using the mask layer 203 as an etching mask.

Specifically, a process for forming the "Σ" shape trenches 205 may include forming inverted trapezoidal pre-trenches (not shown) in the semiconductor substrate 200 at both sides of the PMOS gate structure 210 by a reactive ion etching (RIE) process along the openings 204 of the mask layer 203; and continuously etching the pre-trenches using a wet etching process, such as Tetramethylammonium Hydroxide (TAMH), or $NH_4OH$, etc. Thus, the trenches 205 with the "Σ" shape are formed.

Figure 7:
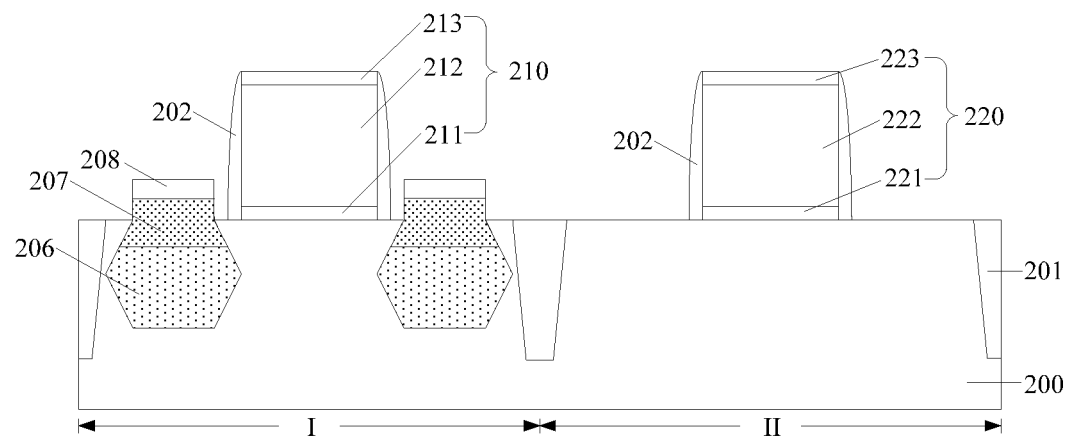

Returning to FIG. 12, after forming the trenches 205, a first stress layer may be formed in the trenches 205 (S105). FIG. 7 illustrates a corresponding semiconductor structure.

As shown in FIG. 7, a stress layer 206 is formed in the trenches 205; and a top surface of the stress layer 206 may be lower than the surface of the semiconductor substrate 200. The first stress layer 206 may increase the stress applied on the channel region of the PMOS transistor. Thus, the carrier mobility of the PMOS transistor may be increased; and electric properties of the PMOS transistor may be optimized.

The first stress layer 206 may be made of any appropriate material. In one embodiment, the first stress layer 206 may be made of SiGe, or SiGeB, etc.

The first stress layer 206 may be a single layer structure. The first stress layer 206 may also be a multiple-stacked layer structure. In one embodiment, the first stress layer 206 is a multiple-stacked layer structure.

When the first stress layer 206 is a single layer structure, the stress layer 206 may include a SiGe bulk layer filled in the trenches 205. The top surface of the stress layer 206 may be lower than the surface of the semiconductor substrate 200.

When the first stress layer 206 is a multiple-stacked layer structure, the first stress layer 206 may include a barrier layer (not shown) formed on bottoms and sidewalls of the trenches 205, a gradient layer (not shown) formed on the barrier layer and a bulk layer (not shown) formed on the gradient layer. A top surface of the first stress layer 206 may be lower than the surface of the semiconductor substrate 200.

The barrier layer may be made of SiGe, etc. For illustrative purposes, a SiGe barrier layer may be used to refer to the barrier layer. The SiGe barrier layer may be used to smooth rough surfaces of the trenches 205 caused by the dry etching process and/or the wet etching process. The rough surface of the trenches 205 may affect the first stress layer 206 to generate a stress in the channel region. After forming the SiGe barrier layer in the trenches 205, the surfaces of trenches 205 may be smoothed; and it may aid to subsequently form a SiGe gradient layer and a SiGe bulk layer with a significantly high quality.

Further, the SiGe barrier layer may be used as a buffer layer for subsequently forming a source region and a drain region by an ion implantation process. The buffer layer (the SiGe barrier layer) may prevent high-energy ions of the ion implantation process from entering into the semiconductor substrate 200 or the channel region. If the high-energy ions enter into the semiconductor substrate 200 or the channel region, a resistivity of the source region and the drain region may drift; and the stability of the PMOS transistor may be reduced. When the bulk layer made of SiGeB is subsequently formed, the SiGe barrier layer may prevent boron ions of the SiGeB bulk layer from laterally diffusing into the channel region of a transistor in the semiconductor substrate 200, thus the stability of the transistor may be improved.

Further, the SiGe barrier layer may prevent severe dislocation defects caused by a lattice mismatch. The lattice mismatch may be caused by a significant difference of a content of Ge in the SiGe gradient layer and the semiconductor substrate 200.

Various processes may be used to form the SiGe barrier layer, such as a CVD process, a PVD process, an ALD process, an FCVD process, or an epitaxial growth process, etc. In one embodiment, the SiGe barrier layer is formed by an epitaxial growth process. Specifically, a temperature of the reaction chamber of the epitaxial growth process may be in a range of approximately 450° C.~700° C.; and a pressure of the reaction chamber may be in a range of approximately 1 Torr~500 Torr. A reaction gas of the epitaxial growth process may include a silicon source gas and a germanium source gas. The silicon source gas may include $SiH_4$ or $SiH_2Cl_2$, etc. The germanium source gas may be $GeH_4$, etc. The reaction gas may also include one or more of HCl, $CH_3Cl$, $CH_2Cl_2$, or $H_2$, etc.

A thickness of the SiGe barrier layer may be in a range of approximately 5 Å~300 Å; and an atomic percentile of Ge in the SiGe barrier layer may be in a range of approximately 0~10%. With the thickness of the SiGe barrier layer increases, a carrier mobility of the channel region of the transistor may correspondingly increase. However, when the thickness of the SiGe barrier layer increases to a certain value, the carrier mobility of the channel region of the transistor may be unable to increase obviously. Further, if the thickness of the SiGe barrier layer is significantly large, a size of the subsequently formed bulk layer may be relatively small; the stress of the channel region provided by the bulk layer may be substantially small.

The gradient layer may be made of any appropriate material. In one embodiment, the gradient layer is made of SiGe. For illustrative purposes, a SiGe gradient layer may be used to refer to the gradient layer The SiGe gradient layer may be used to prevent dislocation defects in the subsequently formed SiGe bulk layer. If the SiGe bulk layer is directly formed on a surface of the SiGe barrier layer, a percentile of Ge in the SiGe bulk layer may be significantly greater than a percentile of the Ge in the SiGe barrier layer, an obstruct Ge percentile change may cause the SiGe bulk layer to have severe crystal defects. Thus, dislocations may be formed in the SiGe bulk layer, and electrical properties of the transistor may be significantly deteriorated. The Ge percentile in the SiGe gradient layer may increase from a Ge percentile in a SiGe seed layer to a Ge percentile in the SiGe bulk layer. Such a Ge percentile change with a gradient manner may substitute the obstruct Ge percentile change, and the dislocations in the SiGe bulk layer may be prevented.

A thickness of the SiGe gradient layer may be in a range of approximately 5 Å~300 Å. The Ge percentile of the SiGe gradient layer may increase from 0 to the Ge percentile of the SiGe bulk layer. If the thickness is of the SiGe gradient layer is substantially small, the Ge percentile may increase significantly fast, thus it may cause the SiGe barrier layer and the SiGe gradient layer to have a crystal mismatch; and dislocations may be formed in the SiGe gradient layer. If the thickness of the SiGe gradient layer is significantly large, a subsequently formed source region and a subsequently formed drain region may have a relatively small volume; and electrical properties of the transistor may be affected.

The bulk layer may be made of any appropriate material, such as SiGe or SiGeB, etc. For illustrative purposes, a SiGe bulk layer may be used to refer to the bulk layer.

The SiGe bulk layer may provide a platform for forming a source region and a drain region; and provide a stress to a channel region between the source region and the drain region.

A Ge atomic percentile of the SiGe bulk layer may be in a range of approximately 10%~50%. Various processes may be used to form the SiGe bulk layer, such as a CVD process, a PVD process, an ALD process, an FCVD process, or an epitaxial growth process, etc. In one embodiment, an epitaxial growth process may be used to form the SiGe bulk layer. Specifically, a temperature of the reaction chamber of the epitaxial growth process may be in a range of approximately 450° C.~700° C.; and a pressure of the reaction chamber may be in a range of approximately 1 Torr~500 Torr.

A reaction gas of the epitaxial growth process may include a silicon source gas and a germanium source gas. The silicon source gas may include $SiH_4$ or $SiH_2Cl_2$, etc. The germanium source gas may be $GeH_4$, etc. The reaction gas may also include one or more of HCl, $CH_3Cl$, $CH_2Cl_2$, or $H_2$, etc. A flow of the silicon source, the germanium source gas and HCl may be in a range of approximately 1 sccm~1000 sccm. A flow of $H_2$ may be in a range of approximately 100 sccm~10000 sccm.

When the SiGe bulk layer is made of SiGeB, boron may be in situ doped during the epitaxial growth of the SiGe bulk layer. A boron source may be introduced into the reaction chamber when the SiGe bulk layer is being formed. Various gases containing boron element may be used as the boron source, such as $B_2H_6$, $B_4H_{10}$ or $B_5H_9$, etc. A flow of the boron source gas may be in a range of approximately 1 sccm~1000 sccm. A concentration of boron in the SiGe bulk layer may be in a range of approximately $1E18$ atom/$cm^3$~$3E20$ atom/$cm^3$. In certain other embodiments, boron may also be doped by a separated process.

The Ge atomic percentile of the SiGe bulk layer may be in a range of approximately 10%~50%. A higher Ge atomic percentile may cause the first stress layer 206 to have more dislocation defects. Further, Ge atoms may not be stable, and may be easily eroded by wet chemicals. Thus, a higher Ge atomic percentile may cause the first stress layer 206 to have weaker anti-erosion ability because of its worse stability and smaller density.

Therefore, if a distance between a top surface of the SiGe bulk layer and the surface of the semiconductor substrate 200, which may be a thickness of a subsequently formed second stress layer for protecting the first stress layer 206, is substantially small, the SiGe bulk layer (the first stress layer 206) may be unable to be protected by subsequently formed layers, thus subsequent wet chemical processes may erode the first stress layer 206; and the quality of the first stress layer 206 may be affected. In one embodiment, the distance between the surface of the first stress layer 206 and the surface of the semiconductor substrate 200 may be in a range of approximately 20 Å~50 Å.

Figure 8:
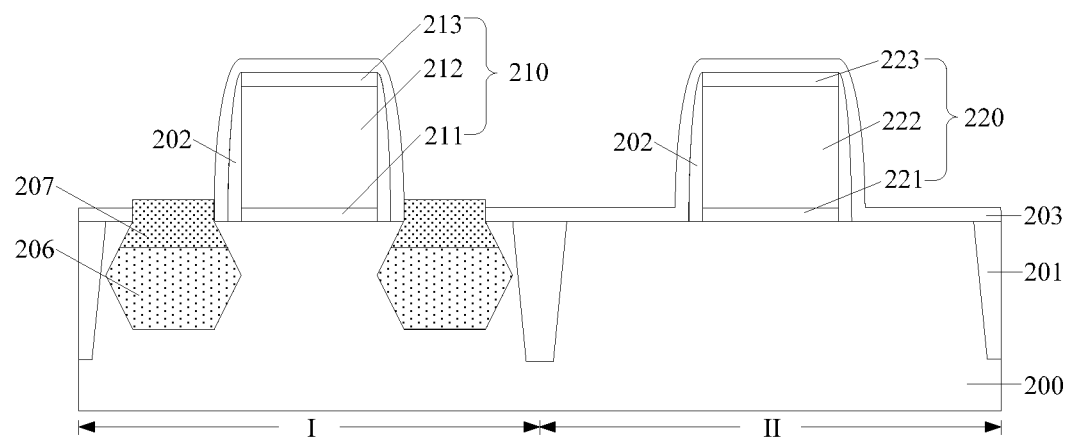

Returning to FIG. 12, after forming the first stress layer 206, a second stress layer may be formed on the first stress layer 206 (S106). FIG. 8 illustrates a corresponding semiconductor structure.

As shown in FIG. 8, a second stress layer 207 is formed on the first stress layer 206. A top surface of the second stress layer 207 may higher than the surface of the semiconductor substrate 200. In certain other embodiments, the top surface of the second stress layer 207 may level with the semiconductor substrate 200.

The second stress layer 207 may be made of any appropriate material containing carbon element. In one embodiment, the second stress layer 207 is made of SiGeC or SiGeBC.

The second stress layer 207 and the first stress layer 206 may together form a stress layer to provide a stress to the channel region of a PMOS transistor. Thus, a carrier mobility of the transistor may be increased; and a drive current of the transistor may be increased.

Further, the carbon atoms in the second stress layer 207 may reduce dislocation defects in the second stress layer 207. In order to provide an enough stress to the channel region of a transistor, the second stress layer 207 may have a relatively large concentration of Ge. If there is no carbon atom in the second stress layer 207, a significantly large amount of dislocation defects may be formed in the second stress layer 207; and the stability of the second stress layer 207 may be unable to match desired requirements. The second stress layer 207 having the carbon atoms have less dislocation defects; and may be relatively dense, thus an anti-erosion ability of the second stress layer 207 to chemicals of subsequent processes may be improved.

The carbon atoms may also have a significantly strong stability, the stability of the second stress layer 207 having the carbon atoms may be improved, thus an erosion rate of the chemicals to the second stress layer 207 may be reduced; and the anti-erosion ability of the second stress layer 207 to the chemicals may be improved.

A concentration of the carbon atoms in the second stress layer 207 may be in a range of approximately $1E18$ atom/$cm^3$~$1E21$ atom/$cm^3$. If the concentration of the carbon atoms is substantially small, it may not be enough to reduce the erosion rate of the chemicals of the subsequent processes. If the concentration of the carbon atoms is significantly large, it may increase difficulties of the fabrication process, and the production cost.

Various processes may be used to form the second stress layer 207, such as a CVD process, a PVD process, an ALD process, an FCVD process, or an epitaxial growth process, etc. In one embodiment, an epitaxial growth process is used to form the second stress layer 207. Specifically, when the second stress layer 207 is made of SiGeC, a reaction gas of the epitaxial growth process may include a silicon source gas, a germanium source gas, a carbon source gas, HCl and $H_2$, etc. The silicon source gas may include $SiH_4$, $Si_2H_6$ or $SiH_2Cl_2$, etc. The germanium source gas may be $GeH_4$, etc. The carbon source gas may include $CH_3SiH_3$, $CH_3Cl$, $CH_2Cl_2$, or $CH_4$, etc. A flow of the silicon source gas, the germanium source gas, the carbon source gas and HCl may be in a range of approximately 1 sccm~1000 sccm. A flow of $H_2$ may be in a range of approximately 100 sccm~50000 sccm. A temperature of the reaction chamber of the epitaxial process may be in a range of approximately 600° C.~800° C.; and a pressure of the reaction chamber may be in a range of approximately 1 Torr~500 Torr.

When the second stress layer 207 is made of SiGeBC, boron may be in situ doped during the epitaxial growth process of the second stress layer 207. A boron source may be introduced into the reaction chamber when the second stress layer 207 is being formed. Various gases containing boron element may be used as the boron source, such as $B_2H_6$, $B_4H_{10}$ or $B_5H_9$, etc. A flow of the boron source gas may be in a range of approximately 1 sccm~1000 sccm. A concentration of boron in the second stress layer 207 may be in a range of approximately $1E18$ atom/$cm^3$~$3E20$ atom/$cm^3$. In certain other embodiments, boron may also be doped by a separated process.

In order to prevent the chemicals of subsequent processes from diffusing into the first stress layer 206, and prevent the first stress layer 206 from being eroded, an embedding depth of the second stress layer 207 into the semiconductor substrate 200 may be in a range of approximately 20 Å—50 Å.

In one embodiment, the epitaxial growth process for forming the first stress layer 206 and the epitaxial growth process for forming the second stress layer 207 may be performed in a same epitaxial growth apparatus, thus the loading and unloading time of the semiconductor substrate 200 may be reduced. Further, the temperature and the pressure of the reaction chamber of the epitaxial growth process for forming the first stress layer 206 and the epitaxial growth process for forming the second stress layer 207 may have a substantially small difference, thus a preparation time of the epitaxial growth apparatus may be reduced. Therefore, the production cycle of transistors may be shortened; and a fabrication efficiency of the transistors may be improved.

Figure 9:
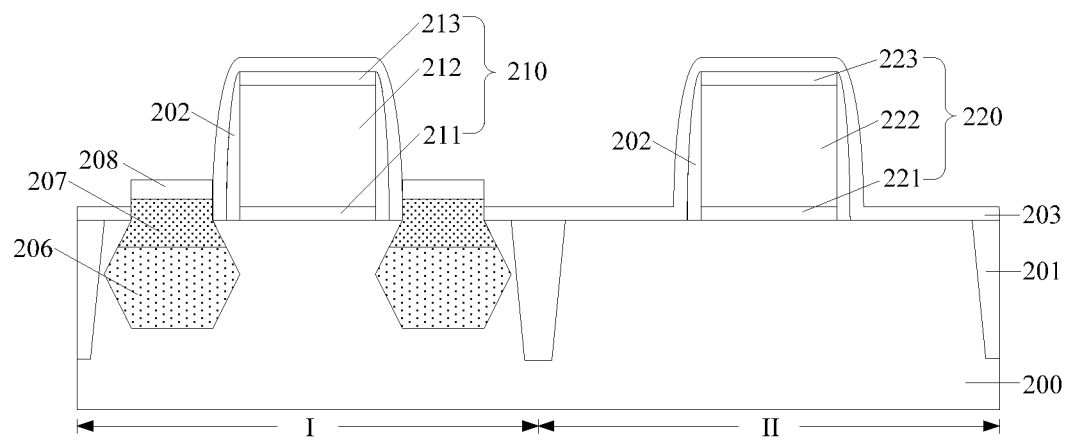

Returning to FIG. 12, after forming the second stress layer 207, a cap layer may be formed on the second stress layer 207 (S107). FIG. 9 illustrates a corresponding semiconductor structure.

As shown in FIG. 9, a cap layer 208 is formed on the second stress layer 207. The cap layer 208 may provide a high quality crystal structure for subsequently forming a metal silicide layer on a source region and a drain region.

The cap layer 208 may be made of any appropriate material, such as Si, SiGe, SiB or SiGeB, etc. An atomic concentration of Ge in the cap layer 208 may be in a range of approximately 0%~20%.

Various processes may be used to form the cap layer 208, such as a CVD process, a PVD process, an ALD process, an FCVD process, or an epitaxial growth process, etc. In one embodiment, the cap layer 208 is formed by an epitaxial growth process.

In one embodiment, the cap layer 208 is made of Si. A reaction gas of the epitaxial growth process may include a silicon source gas, $H_2$ and HCl, etc. The silicon source gas may include $SiH_4$ or $SiH_2Cl_2$, etc. A flow of the silicon source and HCl may be in a range of approximately 1 sccm~1000 sccm. A flow of $H_2$ may be in a range of approximately 100 sccm~10000 sccm. A temperature of the reaction chamber of the epitaxial growth process may be in a range of approximately 600° C.~800° C.; and a pressure of the reaction chamber may be in a range of approximately 1 Torr-500 Torr. A thickness of the cap layer 208 may be in a range of approximately 50 Å~300 Å.

In one embodiment, the cap layer 208 is made of SiB. A mixture gas introduced into a reaction chamber of the epitaxial growth process may include a silicon source gas and a boron source gas, etc. The silicon source gas may include $SiH_4$ or $SiH_2Cl_2$, etc. The boron source gas may include $B_2H_6$, $B_4H_{10}$, or $B_5H_9$, etc. The mixture gas may also include one or more of HCl, $H_2$, $CH_4$, $CH_3Cl$ and $CH_2Cl_2$, etc.

In certain other embodiments, the cap layer 208 is made of SiGe. A mixture gas introduced into a reaction chamber of the epitaxial growth process may include a silicon source gas and a germanium source gas, etc. The silicon source gas may include $SiH_4$ or $SiH_2Cl_2$, etc. The germanium source gas may include $GeH_4$, etc. The mixture gas may also include one or more of HCl, $H_2$, $CH_4$, $CH_3Cl$ and $CH_2Cl_2$, etc.

In one embodiment, the epitaxial growth process for forming the first stress layer 206, the epitaxial growth process for forming the second stress layer 207 and the epitaxial process for forming the cap layer 208 may be performed in a same epitaxial growth apparatus, thus the loading and unloading time of the semiconductor substrate 200 may be reduced. Further, the temperature and the pressure of the reaction chamber of the epitaxial growth process for forming the first stress layer 206, the epitaxial growth process for forming the second stress layer 207 and the epitaxial process for forming the cap layer 208 may have a substantially small difference, thus a preparation time of the epitaxial growth apparatus may be reduced. Therefore, a production cycle of transistors may be shortened; and a fabrication efficiency of the transistors may be improved.

Returning to FIG. 12, after forming the cap layer 208, the mask layer 203 may be removed (S108). FIG. 10 illustrates a corresponding semiconductor structure.

Various processes may be used to remove the mask layer 203, such as a dry etching process, or a wet etching process, etc. In one embodiment, the mask layer 203 is removed by a wet etching process. An etching solution of the wet etching process may be a hot phosphoric acid solution. A temperature of the hot phosphoric acid solution may be in a range of approximately 120° C.~200° C. A mass percentile of the phosphoric acid may be in a range of approximately 60%~85%.

Using the wet etching process to remove the mask layer 203, damages to the second stress layer 207 and the first stress layer 206 may be relatively small because the second stress layer 207 may contain carbon atoms. The carbon atoms may reduce dislocation defects in the second stress layer 207 caused by a high Ge atomic percentile, and a density of the second stress layer 207 may be improved. Further, the carbon atoms in the second stress layer 207 may increase the stability of the second stress layer 207. When chemicals of the wet etching process contact with the second stress layer 207, the chemicals (etching solutions) may be unable to diffuse into the second stress layer 207 because of the improved density. Further, because the second stress layer 207 containing the carbon atoms may have a desired stability, an erosion rate of the chemicals to the second stress layer 207 may be reduced. Thus, an erosion of the chemicals of the wet etching process to the second stress layer 207 may be less severe. Further, the second stress layer 207 may be formed on the first stress layer 206, the chemicals may be unable to erode the first stress layer 206.

Returning to FIG. 12, after removing the mask layer 203, a tensile stress layer may be formed in the semiconductor substrate 200 at both sides of the NMOS gate structure 220 (S109). FIG. 11 illustrates a corresponding semiconductor structure.

As shown in FIG. 11, a tensile stress layer 209 is formed in the semiconductor substrate 200 at both sides of the NMOS gate structure 220. The tensile stress layer 209 may provide a tensile stress to a channel region in the NMOS region II. Thus, a carrier mobility of the channel region in the NMOS region II may be increased; and a drive performance of the transistor may be enhanced.

The tensile stress layer 209 may be made of any appropriate material. In one embodiment, the tensile stress layer 208 is made of SiC. An atomic percentile of carbon in the tensile stress layer 209 may be in a range of approximately 0%~10%.

Various processes may be used to form the tensile stress layer, such as a CVD process, a PVD process, an ALD process, an FCVD process, or an epitaxial growth process, etc. In one embodiment, the tensile stress layer 209 is formed by a selective epitaxial growth process.

In certain other embodiments, the tensile stress layer 209 may be formed before forming the first stress layer 206 and the second stress layer 207. In certain other embodiments, the tensile stress layer 209 may be omitted.

After forming the tensile stress layer 209, a first patterned photoresist layer (not shown) may formed on the surface of the semiconductor substrate 200; and a source region (not labeled) and a drain region (not labeled) of a PMOS transistor may be formed at both sides of the PMOS gate 210 by an ion implantation process performed on the PMOS region I using the first patterned photoresist layer as an etching mask. Thus, the source region and the drain region may be a sandwich-like film stack including the first stress layer 206 (may be referred as a bottom layer), the second stress layer 207 (may be referred as a carbon containing middle layer) and the cap layer 208 (may be referred as a top layer). The Cap layer 208 may be above the surface of the semiconductor substrate 200.

Then, the first patterned photoresist layer may be removed. Further, a second patterned photoresist layer (not shown) may be formed on the surface of the semiconductor substrate 200; and a source region (not labeled) and a drain region (not labeled) of an NMOS transistor may be formed at both sides of the NMOS gate structure 220 by an ion implantation process performed on the NMOS region II using the second patterned photoresist layer as an etching mask. Then, the second patterned photoresist layer may be removed.

Various processes may be used to remove the first photoresist layer and the second photoresist layer, such as a dry etching process or a wet etching process, etc. In one embodiment, the first photoresist layer and the second photoresist layer may be removed by a wet etching process. Chemicals of the wet etching process may be a mixture of sulfuric acid and hydrogen peroxide, etc.

After removing first photoresist layer and the second photoresist layer by the wet etching process, damages to the second stress layer 207 and the first stress layer 206 may be relatively small; and morphologies of the second stress layer 207 may not be changed because the second stress layer 207 may contain carbon atoms. The carbon atoms may reduce dislocation defects in the second stress layer caused by a high Ge atomic percentile, and a density of the second stress layer 207 may be improved. Further, the carbon atoms in the second stress layer 207 may increase the stability of the second stress layer 207. When chemicals of the wet etching process contact with the second stress layer 207, the chemicals (etching solutions) may be unable to diffuse into the second stress layer 207 because of the improved density. Further, because second stress layer 207 containing the carbon atoms may have a desired stability, an erosion rate of the chemicals to the second stress layer 207 may be reduced. Thus, an erosion of the chemicals of the wet etching process to the second stress layer 207 may be less severe. Further, the second stress layer 207 may be formed on the first stress layer 206, the chemicals may be unable to erode the first stress layer 207.

Thus, a transistor may be formed by the above disclosed processes and methods, the corresponding PMOS transistor is illustrated in FIG. 11. The transistor includes a semiconductor substrate 200 having a first region I; and a plurality of isolation structures 201 in a surface of the semiconductor substrate 200. The transistor also includes a first gate structure 210 having a first dielectric layer 111 formed on the surface of the semiconductor substrate 200, a first gate electrode layer 212 formed on the first dielectric layer 111 and a cap layer 213 formed on the first gate electrode layer 212 formed on the semiconductor substrate 200 in the first region; and sidewall spacers formed around the first gate structure 210.

Further, the transistor includes a first stress layer 206 formed in the surface of the semiconductor substrate 200, and a second stress layer 207 containing carbon atoms formed on the first stress layer 206; and a cap layer 208 formed on the second stress layer 207. Further, the transistor also includes a source region (not labeled) and a drain region (not labeled) in the semiconductor substrate 200 at both sides of the first gate structure 210. The detailed structures and intermediate structures are described above with respect to the fabrication methods.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:
1. A method for fabricating a transistor, comprising:
providing a semiconductor substrate having a first region;
forming a first gate structure on a surface the semiconductor substrate in the first region;
forming trenches in the semiconductor substrate at both sides of the first gate structure;
forming a first stress layer with a top surface lower than the surface semiconductor substrate in the trenches;
forming a second stress layer containing carbon atoms with a surface leveling with or higher than the surface of the semiconductor substrate on the first stress layer;
forming a cap layer on the second stress layer by an epitaxial growth process;
removing the mask layer; and
forming a source region and a drain region at both sides of the first gate structure.

2. The method according to claim 1, wherein:
the first region is a PMOS region; and
the first gate structure is a PMOS gate structure.

3. The method according to claim 1, wherein:
the second stress layer is made of SiGeC or SiGeBC.

4. The method according to claim 1, wherein:
a concentration of the carbon atoms in the second stress layer is in a range of approximately 1E18atom/cm$^3$~1E21atom/cm$^3$.

5. The method according to claim 1, after forming the first gate structure further including:
forming a mask layer with openings on the semiconductor substrate.

6. The method according to claim 1, wherein:
a thickness of the second stress layer is in a range of approximately 50 Å~100 Å.

7. The method according to claim 1, wherein:
the first stress layer is made of SiGe or SiGeB.

8. The method according to claim 1, wherein:
the first stress layer is a single layer, or a multiple-stacked layer.

9. The method according to claim 1, wherein:
the semiconductor substrate has a second region;
the second region is an NMOS region; and
an NMOS gate structure is formed on the surface of the semiconductor substrate in the NMOS region.

10. The method according to claim 1, wherein:
the first stress layer and the second stress layer are formed by an epitaxial growth process in a same epitaxial growth apparatus.

11. The method according to claim 9, after forming source region and the drain region in the semiconductor substrate at both sides of the PMOS gate, further including:
forming tensile stress layer in the semiconductor substrate at both sides of the NMOS gate structure; and
forming a source region and a drain region in the semiconductor substrate at both sides the NMOS gate structure.

12. A transistor, comprising:
a semiconductor substrate having a first region;
a first gate structure formed on a surface of the semiconductor substrate in the first region;
a first stress layer with a top surface lower than the surface of the semiconductor substrate formed in the semiconductor substrate at both sides of the first gate structure;
a second stress layer containing carbon atoms formed on the first stress layer;
a cap layer formed on the second stress layer, wherein a top surface of the cap layer is higher than the surface of the semiconductor substrate and the cap layer is made of Si, SiGe or SiGeB; and a source region and a drain region formed in the semiconductor substrate at both sides of the first gate structure,
wherein the source region and the drain region are formed by:
forming trenches in the semiconductor substrate at both sides of the first gate structure;
forming the first stress layer with the top surface lower than the surface of the semiconductor substrate in the trenches;
forming the second stress layer containing carbon atoms with a surface leveling with or higher than the surface of the semiconductor substrate on the first stress layer; and
forming the source region and the drain region by an ion implantation process.

13. The semiconductor structure according to claim 12, wherein:
the first region is a PMOS region; and
the first gate structure is a PMOS gate structure.

14. The semiconductor structure according to claim 12, wherein the semiconductor substrate further includes:
an NMOS region;
an NMOS gate structure formed on the semiconductor substrate in the NMOS region; and
a source region and a drain region formed in the semiconductor substrate at both sides of the NMOS gate structure.

15. The semiconductor structure according to claim 12, wherein:
the first stress layer is a single layer or a multiple-stacked layer having a barrier layer, a gradient layer and a bulk layer;
the first stress layer is made of SiGe or SiGeB;
an atomic percentile of Ge in the first stress layer varies in a range of approximately 10%~50%; and
a concentration of boron is in a range of approximately $1E18 atom/cm^3$~$3E20 atom/cm^3$.

16. The semiconductor structure according to claim 12, wherein:
the second stress layer is made of SiGeC or SiGeBC;
a thickness of the second stress layer is in range of approximately 20 Å~50 Å; and
a carbon concentration of the second stress layer is in a range of approximately $1E18 atom/cm^3$~$1E21 atom/cm^3$.

* * * * *